(12) United States Patent
Hsu et al.

(10) Patent No.: US 9,658,252 B2
(45) Date of Patent: May 23, 2017

(54) PROBE INSERTION AUXILIARY AND METHOD OF PROBE INSERTION

(75) Inventors: Tung-Chung Hsu, Hsinchu County (TW); Yong-Feng Lin, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 1169 days.

(21) Appl. No.: 13/031,589

(22) Filed: Feb. 21, 2011

(65) Prior Publication Data
US 2012/0210574 A1    Aug. 23, 2012

(51) Int. Cl.
*G01R 31/28*     (2006.01)
*G01R 3/00*      (2006.01)
*G01R 1/073*     (2006.01)

(52) U.S. Cl.
CPC .......... *G01R 3/00* (2013.01); *G01R 1/07357* (2013.01); *Y10T 29/49117* (2015.01); *Y10T 29/5313* (2015.01)

(58) Field of Classification Search
CPC .... G01R 31/2808; G01R 1/04; G01R 1/0408; Y10T 29/49117; Y10T 29/5313
USPC .............. 29/705, 739, 593, 407.01; 324/537, 324/750.23, 756.02
See application file for complete search history.

(56) References Cited

U.S. PATENT DOCUMENTS

| | | | |
|---|---|---|---|
| 3,760,266 A | 9/1973 | Ocasio | |
| 4,230,986 A * | 10/1980 | Deaver | G01R 31/2808 324/756.05 |
| 6,356,090 B2 | 3/2002 | Deshayes | |
| 6,583,904 B1 * | 6/2003 | Mahlab | G02B 6/43 398/121 |
| 7,030,636 B1 * | 4/2006 | Bergan | G01R 31/045 324/756.04 |
| 7,056,000 B2 * | 6/2006 | Hussey | G01R 31/2635 250/208.1 |
| 7,129,722 B1 * | 10/2006 | Brophy | G01R 31/304 257/98 |
| 2002/0036739 A1 * | 3/2002 | Shuto | G02F 1/133711 349/123 |
| 2009/0146674 A1 * | 6/2009 | Tanabe | G01R 31/2808 324/750.01 |
| 2010/0164519 A1 | 7/2010 | Sellathamby | |

FOREIGN PATENT DOCUMENTS

| | | |
|---|---|---|
| TW | 200718946 | 5/2007 |
| TW | 201027081 | 7/2010 |
| TW | 201035573 | 10/2010 |

* cited by examiner

*Primary Examiner* — Peter DungBa Vo
*Assistant Examiner* — Jeffrey T Carley
(74) *Attorney, Agent, or Firm* — Winston Hsu; Scott Margo

(57) ABSTRACT

A probe insertion auxiliary and a method of probe insertion are provided. A light source illuminates holes on a lower die to make the position of the holes clear for an operator. The probe insertion auxiliary includes a bottom and a clamp pair disposed on the bottom. The clamp pair has two clamp parts. The two clamp parts define a slit for disposing a probe chassis. Furthermore, the two clamp parts and the bottom form a space. A light source is disposed inside the space for illuminating the holes.

6 Claims, 6 Drawing Sheets

PROBE INSERTION AUXILIARY AND METHOD OF PROBE INSERTION

BACKGROUND OF THE INVENTION

1. Field of the Invention

The present invention relates to a probe insertion auxiliary, and more particularly to an auxiliary for inserting probes onto a probe card.

2. Description of the Prior Art

In general, semiconductor products are manufactured by performing a complex series of processes such as manufacturing a silicon wafer and forming patterns on the silicon wafer to fabricate semiconductor dies.

When processing wafers of a semiconductor, to determine if dies on a wafer are good or bad, a test bench and a probe card are required to perform testing. A precise contact mechanism is provided on the probe card to contact each die on the wafer as well as a conduction circuit which performs an electrical test, so as to assure that the electrical properties and performance of the dies are manufactured according to the design specification.

Please refer to FIG. 1. FIG. 1 depicts a side view of a conventional probe card schematically. As shown in FIG. 1, a probe card 10 comprises a probe head 12. The probe head 12 includes four parts: an upper die 14, a film 16, a lower die 18 and probes 20. Each of the probes 20 penetrates the upper die 14, the film 16 and the lower die 18. The position of each of the probes 20 corresponds to the test pads 24 on the semiconductor wafer 22. Furthermore, the probe card 10 has a substrate 26 and a printed circuit board (PCB) 28. One side of the substrate 26 contacts the probes 20 and the other side of the substrate 26 contacts the PCB 28. The substrate 26 converts the signal of the probes 20 to the PCB 28. It should be noted that the distance between each probe 20 is around 50 to 100 μm. Furthermore, each of the probes 20 is not straight, and has a zigzag-shaped part 30.

Currently, the probe insertion process is performed by penetrating each probe through the lower die and the film by hand. When all the probes are penetrated and fixed on the lower die and the film, the upper die then covers the film. Because the density of the probes is high, and there is a zigzag part on each probe, however, it is hard for the operator to penetrate the probe through the lower die and the film by hand based on experience only.

SUMMARY OF THE INVENTION

In light of the above, a probe insertion auxiliary is provided in the present invention to help probes be inserted easily.

According to a preferred embodiment of the present invention, a probe insertion auxiliary includes: a bottom; a clamp pair disposed on the bottom, the clamp pair having two clamp parts, the two clamp parts defining a slit for engaging a probe chassis, and the two clamp parts and the bottom forming a space; and a light source disposed inside the space for illuminating the holes on the probe chassis.

According to another preferred embodiment of the present invention, a method of probe insertion includes:
first, a probe insertion auxiliary is provided, where the probe insertion auxiliary comprises: a bottom, a clamp pair disposed on the bottom, the clamp pair having two clamp parts, the two clamp parts defining a slit, and the two clamp parts and the bottom forming a space wherein a light source is disposed inside the space. Later, a probe chassis is put into the slit, wherein the probe chassis has a plurality of holes, and the light source illuminates the holes. Finally, a probe insertion process is performed.

As the size of a die becomes smaller, the probes and the holes on the probe chassis shrink as well. Therefore, the insertion of the probes becomes harder and harder. The probe insertion auxiliary of the present invention can make the probe insertion process easier by illuminating the lower die using a light source during the insertion process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
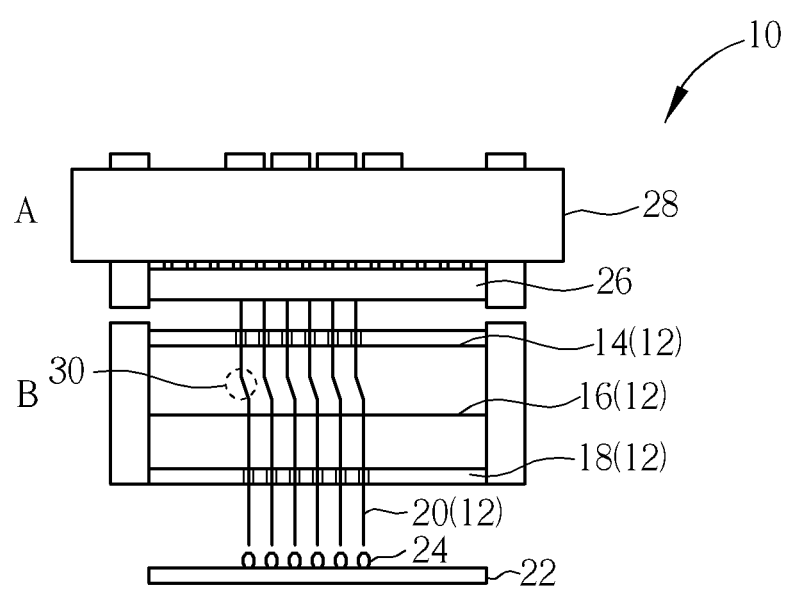
FIG. 1 depicts a side view of a conventional probe card schematically.
Figure 2:
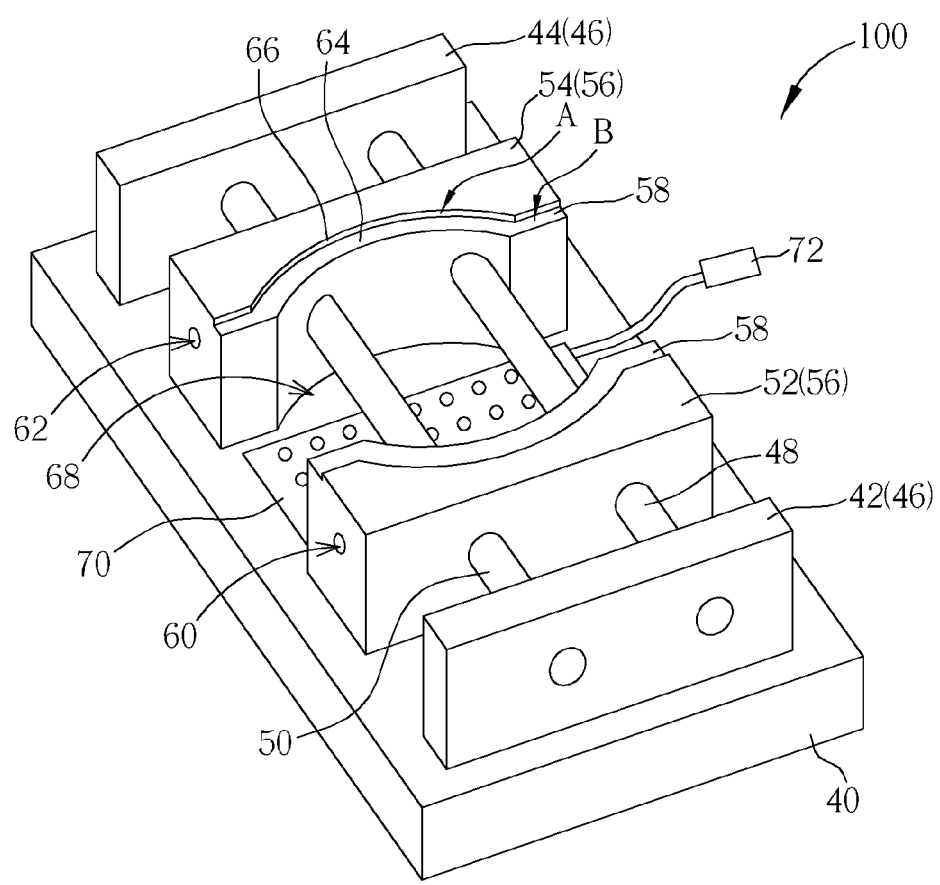
FIG. 2 depicts a probe insertion auxiliary of the present invention schematically.

FIG. 2 depicts a probe insertion auxiliary of the present invention schematically. As shown in FIG. 2, the probe insertion auxiliary 100 has a bottom 40. The bottom 40 may be in the shape of a rectangle having a short side and a long side, but is not limited to this shape. Two bodies 42, 44 comprise a body pair 46. The two bodies 42, 44 are disposed at two opposing sides of the bottom 40. For example, the two bodies 42, 44 can be disposed on the two opposing short sides of the bottom 40. Two rods 48, 50 are disposed between the bodies 42, 44. Two ends of each of the two rods 48, 50 are fixed on the opposing surfaces of the two bodies 42, 44. Furthermore, a clamp pair 56 consisting of two clamp parts 52, 54 is disposed on the bottom 40. The clamp pair 56 is disposed between the two bodies 42, 44. The two clamp parts 52, 54 are penetrated by the two rods 48, 50 so that the two clamp parts 52, 54 can move freely along the extending direction of the rods 48, 50, and change the relative position of the two clamp parts 52, 54. The relative positions of the top portions of the two clamp parts 52, 54 define a slit 58 with an adjustable size. The slit 58 is for containing a probe chassis (not shown). Moreover, two fixing parts 60, 62 are disposed on the clamp parts 52, 54, respectively. When the clamp parts 52, 54 are moved to suitable relative positions, the fixing parts 60, 62 can be used to fix the positions of the clamp parts 52, 54. Moreover, the bodies 42, 44 limit the positions of the clamp parts 52, 54 between the bodies 42, 44.

Slit 58 includes a first region A and a second region B. The first region A has a shape which is a counterpart of a circle. For example, the shape of the first region A can be an arc so that the first region A can be engaged with a circle probe chassis. The second region B has a shape which is a counterpart of a rectangular. For example, the shape of the second region B can be a line or an angle, so that the second region B can be engaged with a rectangular probe chassis. Furthermore, the slit 58 has a bottom surface 64 and a side surface 66. The side surface 64 is used to support the probe chassis, and the side surface 66 is for engaging the probe chassis inside the slit 58. According to a preferred embodiment of the present invention, the width of the bottom surface 64 is 5 mm, and the width of the side surface 66 is 3 mm.

Figure 3:
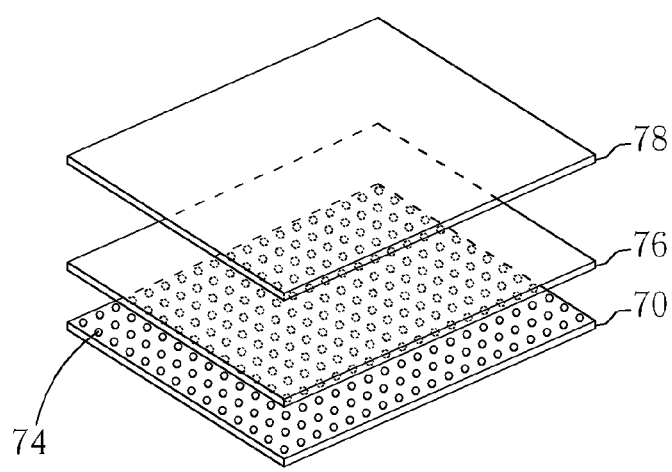
FIG. 3 depicts a magnified diagram of the light source.

It is noteworthy that the lower part of the two clamp parts 52, 54 together with the bottom 40 forms a space 68. A light source 70 can be disposed inside the space 68 for illuminating the probe chassis inside the slit 58. The switch 72 of the light source 72 can extend from the space 68, and be disposed outside of the probe insertion auxiliary 100. The light source 70 preferably has a sufficient light that can pass through the probe chassis and reach the operator's eyes. FIG. 3 depicts a magnified diagram of the light source. As shown in FIG. 3, light source 70 can be an LED matrix with an area of 4 cm×4 cm formed by numerous LEDs 74. Alternatively, the light source 70 can be at least a light bulb. Furthermore, at least an alignment film 78 and at least a polarizing film 76 are disposed on the light source 70. According to a preferred embodiment of the present invention, six alignment films 78 and one polarizing film 76 can make light from the light source 70 become uniform.

Figure 5A:
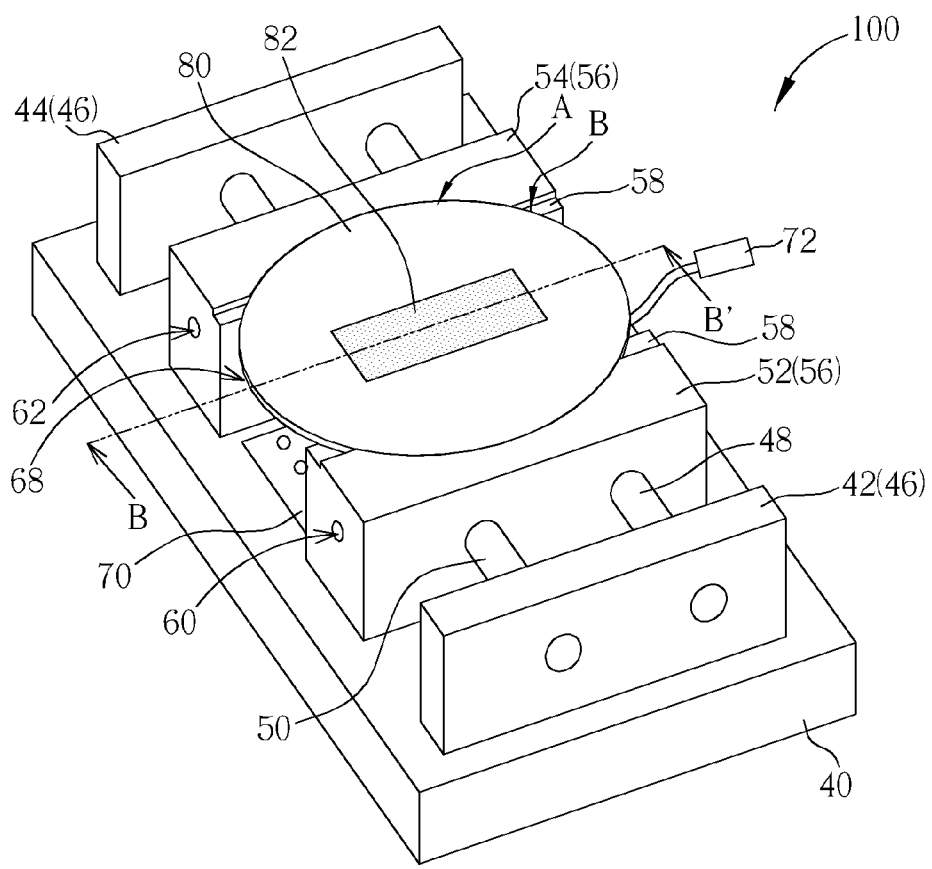
Figure 5B:
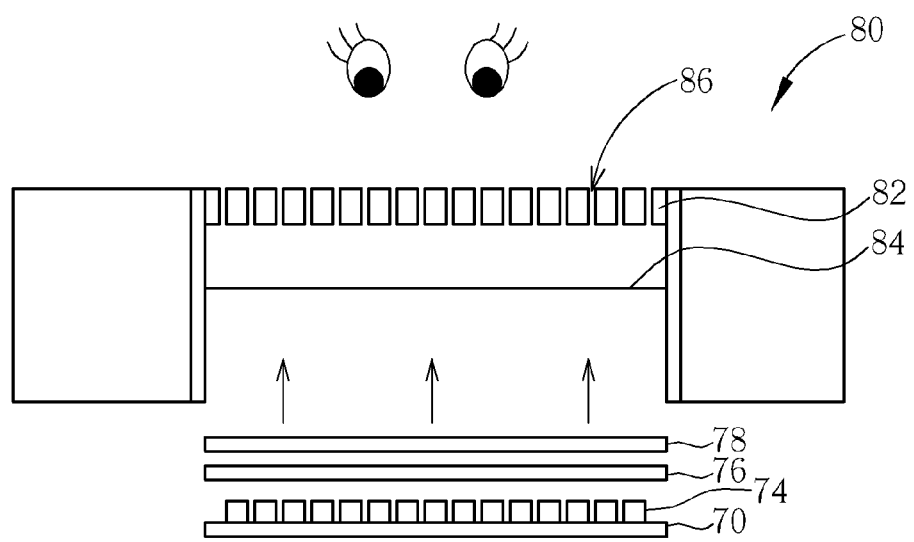
Figure 6:
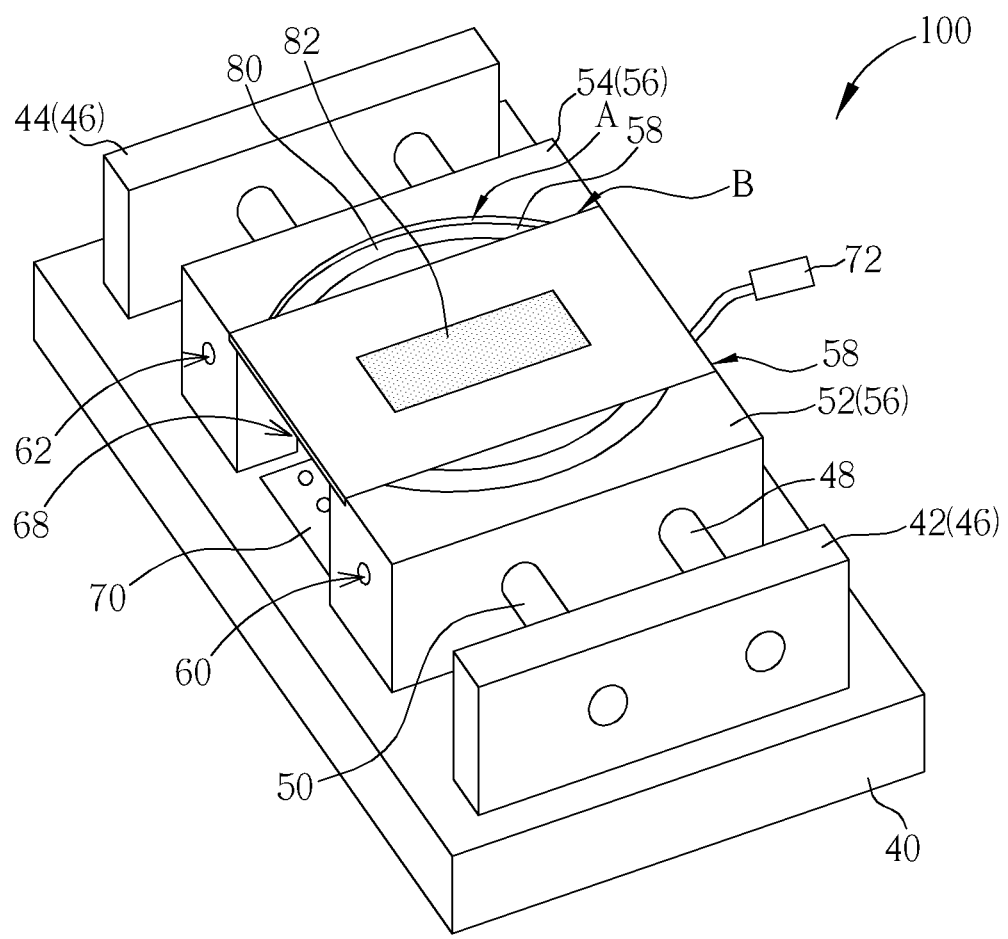
Figure 7A:
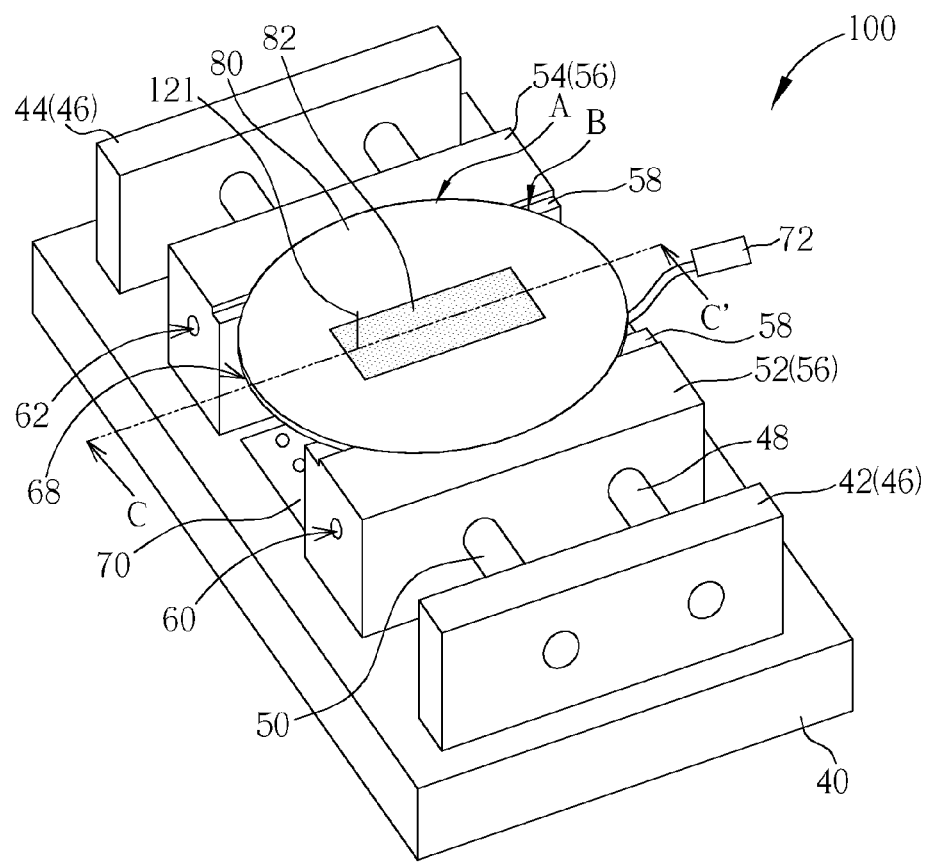
Figure 7B:
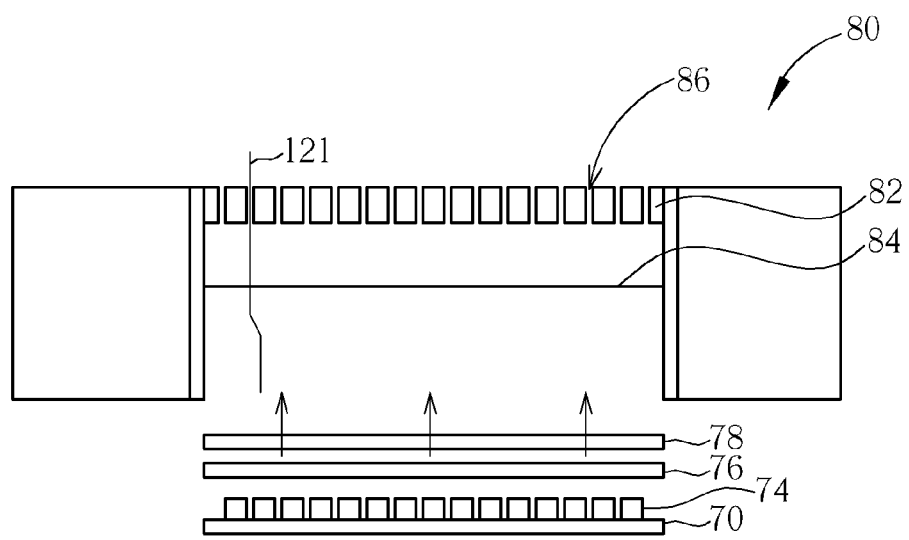

FIGS. 4a-7b depict a method of probe insertion of the present invention. FIG. 4b depicts a side view of a probe chassis along the line AA' shown in FIG. 4a. FIG. 5b depicts a side view of a probe chassis and a light source along the line BB' shown in FIG. 5a. FIG. 7b depicts a side view of a probe chassis along the line CC' shown in FIG. 7a.

Figure 4A:
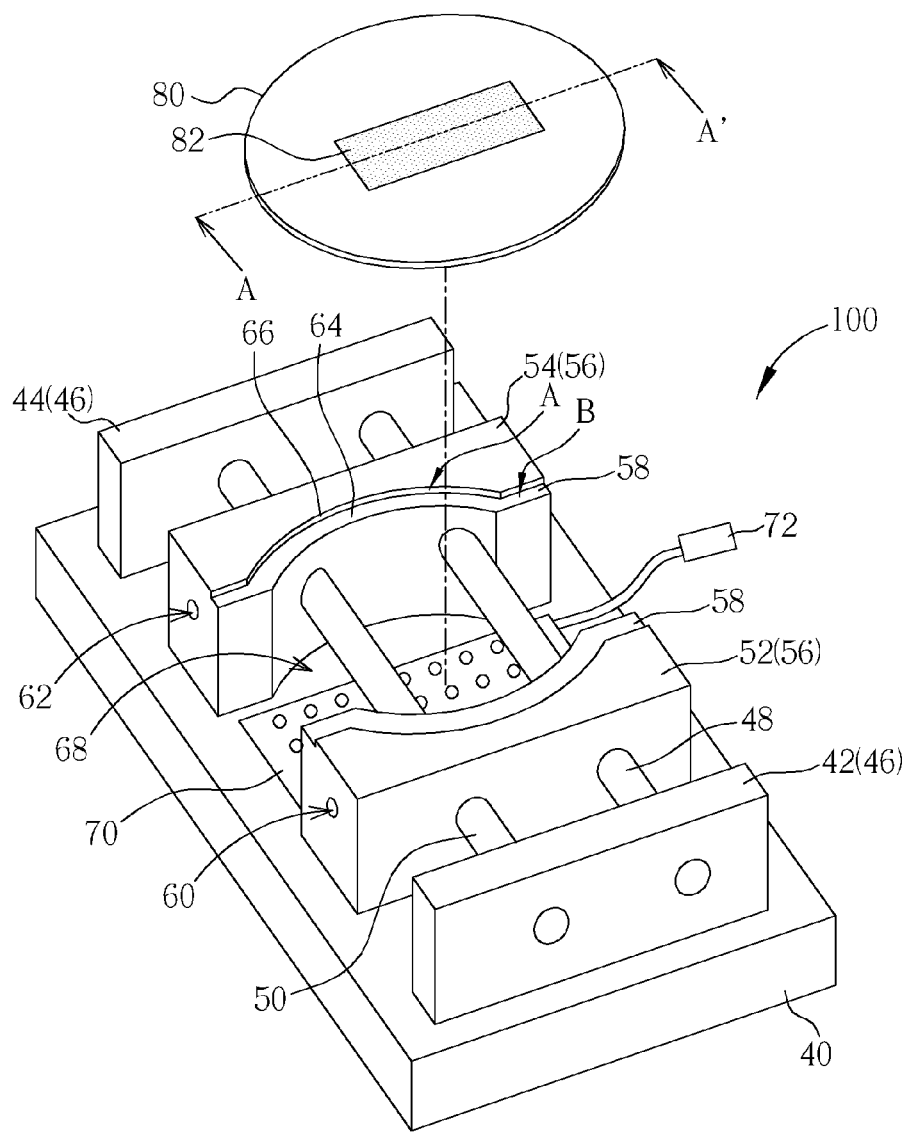
FIGS. 4a-7b depict a method of probe insertion of the present invention.
Figure 4B:
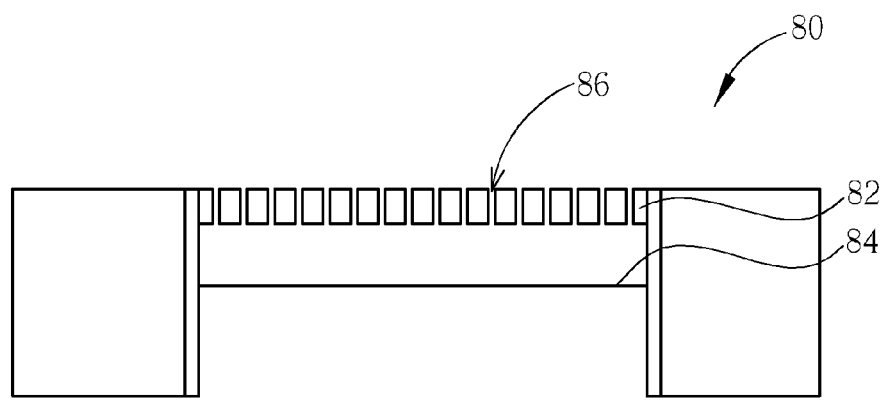

As shown in FIGS. 4a and 4b, first, a probe insertion auxiliary 100 (shown in FIG. 2) and a probe chassis 80 are provided. The probe chassis 80 includes a film 84 and a lower die 82. The lower die 82 has numerous holes 86 thereon. In FIG. 4a, the probe chassis is a circular shape; however, for different products, the probe chassis can have different shapes.

Then, as shown in FIGS. 5a and 5b, the probe chassis 80 is disposed inside the slit 58 with the lower die 82 facing up. The position of the clamp parts 52, 54 is adjusted to contact the probe chassis 80 after the probe chassis 80 is inside the slit 58. Later, the relative positions of the clamp parts 52, 54 are fixed by the fixing parts 60, 62. In FIG. 5a, the probe chassis 80 is in the shape of a circle. The probe chassis 80 is engaged with the slit 58 by the first region A. Then, the light source 70 is turned on, and the light from the light source 70 passes through the probe chassis 80 along a first direction. In detail, the light from the light source 70 passes through the film 84, and later passes through the holes 86 on the lower die 52. Finally, the light from the light source 70 enters the operator's eyes. FIG. 6 depicts a rectangular probe chassis engaged with the probe insertion auxiliary. As shown in FIG. 6, the probe chassis 80 can be rectangular. The rectangular probe chassis 80 is engaged with the slit 58 by the second region B.

As shown in FIGS. 7a and 7b, a probe 121 penetrates the hole 86 in a second direction. In detail, the probe 121 penetrates the hole 86 of the lower die 82, then continues to penetrate the film 84. Therefore, the second direction is parallel to the first direction. The probe 121 can be a vertical probe with a zigzag-shaped part or any other kinds of probe. When performing the probe insertion process, the light source 70 illuminates the holes 86 to make the holes bright, so that the operator can see the position of the holes 86 clearly and correctly. Therefore, even an inexperienced operator can insert the probe precisely. After all probes are inserted, the upper die can be covered on the probe chassis. At this point, the upper die, the film, the lower die and the probes comprise a probe head. Finally, the probe head is fixed with the probe card.

Because the probe tip contacts the test pad on the semiconductor wafer during testing, the probe tip may be worn down after numerous testing. At this point, the ruined probe needs to be replaced by a new probe. The probe insertion auxiliary of the present invention can help with the replacement of the probe. Furthermore, when a new semiconductor wafer is produced, a new probe layout is designed to match the new semiconductor wafer. At this point, the probe insertion auxiliary of the present invention can be used to insert the probes onto the probe card.

The probe insertion auxiliary of the present invention is suitable for many types of probe chassis. An operator can adjust the clamp parts of the probe insertion auxiliary to match the size of the probe chassis. Moreover, the light source illuminates the holes on the lower die and illuminates the film so the operator can see the holes clearly. Therefore, the probe can be inserted more precisely.

Those skilled in the art will readily observe that numerous modifications and alterations of the device and method may be made while retaining the teachings of the invention.

What is claimed is:

1. A probe insertion auxiliary, comprising:
  a bottom;
  a clamp pair disposed on the bottom, the clamp pair having two clamp parts, the two clamp parts defining a slit for engaging a probe chassis inside the slit, and the two clamp parts and the bottom forming a space, wherein the size of the slit is adjustable and both of the clamp parts contact the probe chassis;
  a plurality of holes disposed on the probe chassis;
  a probe penetrating one of the holes along a first direction; and
  a light source disposed inside the space for illuminating the holes on the probe chassis, and wherein a light from the light source passes through the probe chassis in a second direction to illuminate the holes, and the first direction is parallel to the second direction; wherein the light source comprises a plurality of LEDs or light bulbs, and wherein at least one polarizing film and at least one alignment film are disposed on the plurality of LED or light bulbs.

2. The probe insertion auxiliary of claim 1, wherein the size of the slit is adjusted by changing the relative positions of the two clamp parts.

3. The probe insertion auxiliary of claim 1, wherein two fixing parts are disposed on the two clamp parts respectively.

4. The probe insertion auxiliary of claim 1, wherein the slit comprises a first region and a second region.

5. The probe insertion auxiliary of claim 4, wherein the first region has a shape which is a counterpart of a circle for engaging a circle probe chassis.

6. The probe insertion auxiliary of claim 4, wherein the second region has a shape which is a counterpart of a rectangle for engaging a rectangular probe chassis.

* * * * *